(12) United States Patent
Suzuki et al.

(10) Patent No.: US 6,768,537 B2
(45) Date of Patent: Jul. 27, 2004

(54) PROJECTION OPTICAL SYSTEM, EXPOSURE APPARATUS, AND EXPOSURE METHOD

(75) Inventors: Takeshi Suzuki, Ageo (JP); Hideki Komatsuda, Ageo (JP); Yasuhiro Omura, Kumgaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/417,120

(22) Filed: Apr. 17, 2003

(65) Prior Publication Data

US 2003/0218729 A1 Nov. 27, 2003

(30) Foreign Application Priority Data

Apr. 18, 2002 (JP) ..................................... P2002-115718
Apr. 3, 2003 (JP) ..................................... P2003-100090

(51) Int. Cl.[7] .............................................. G03B 27/48
(52) U.S. Cl. .............................. 355/51; 355/53; 355/77; 356/121; 250/548; 430/5
(58) Field of Search ............................... 355/43, 45, 51, 355/53, 77; 430/5; 250/548; 356/121

(56) References Cited

U.S. PATENT DOCUMENTS 6,433,854 B2 * 8/2002 Baker et al. .................. 355/77
2002/0159049 A1 * 10/2002 Sato et al. .................. 356/121

* cited by examiner

Primary Examiner—D. Rutledge
(74) Attorney, Agent, or Firm—Finnegan, Henderson, Farabow, Garrett & Dunner, L.L.P.

(57) ABSTRACT

A projection optical system for forming an image of a pattern in a first plane onto a second plane using exposure light in a wavelength region of shorter than 200 nm. When a projection pattern placed in the first plane and having a dark pattern and a light pattern around the dark pattern is projected onto the second plane, an average illuminance in a area where a projected image of the dark pattern is formed in the second plane is 8 or less, where an illuminance of an image of the light pattern around the dark pattern in the second plane is set to be 100.

21 Claims, 10 Drawing Sheets

PATTERN S

Fig.7

PATTERN S

PROJECTION OPTICAL SYSTEM, EXPOSURE APPARATUS, AND EXPOSURE METHOD

BACKGROUND OF THE INVENTION

1. Field of the Invention

The present invention relates to a projection optical system for projecting an image of a pattern of a reticle onto a substrate, an exposure apparatus including the projection optical system, and an exposure method using the exposure apparatus.

2. Related Background of the Invention

In recent years, high integration and high density in semiconductor integrated circuits have been progressed. In order to narrow the line widths of semiconductor integrated circuits and make circuit patterns more precise, it is desired that the resolutions of photolithography in exposure apparatuses for semiconductor integrated circuit manufacture be further improved. In order to improve the resolutions of photolithography in exposure apparatuses, the wavelengths of exposure light for use in exposure apparatuses have been shortened to those of g-line (436 nm), i-line (365 nm), and KrF excimer laser light (248 nm) until now. Currently, the wavelengths of exposure light is tried to be further shortened to those of exposure light in a wavelength region of shorter than 200 nm, that is, ArF excimer laser light (193 nm) and $F_2$ laser light (157 nm)

Here, in exposure apparatuses, fluorite ($CaF_2$ and the like) having an extremely high light transmittance in a short wavelength region has come to be used as material for some of the optical elements constituting projection optical systems due to the fact that the wavelengths of exposure light have been shortened.

SUMMARY OF THE INVENTION

Incidentally, in the above-described exposure apparatuses, it has been known that local flare exists on a wafer, in other words, that flare light reaches the surrounding portion of the point on a wafer where the zero-order light from exposure light reaches. Due to the existence of such local flare, when a pattern having a predetermined line width is formed on a wafer, the formed pattern becomes narrower than the predetermined line width. Accordingly, a manufactured semiconductor device may not have as good performance as desired.

An object of the present invention is to provide a projection optical system in which local flare is limited within an allowable range, an exposure apparatus including this projection optical system, and an exposure method using this exposure apparatus.

The projection optical system of a first aspect of the present invention is a projection optical system for forming an image of a pattern in a first plane onto a second plane using exposure light in a wavelength region of shorter than 200 nm. This projection optical system has a feature in that, when a projection pattern which has a dark pattern and a bright pattern around the dark pattern and which is placed in the first plane is projected onto the second plane, the average illuminance in the area where a projected image of the dark pattern is formed in the second plane is 8 or less, where the illuminance of an image of the bright pattern around the dark pattern in the second plane is set to be 100.

Here, in the projection optical system of the first aspect of the present invention, when a projection pattern which has a dark pattern and a bright pattern around the dark pattern and is placed in the first plane is projected onto the second plane, the average illuminance in the area where a projected image of the dark pattern is formed in the second plane is preferably 5 or less, where the illuminance of an image of the bright pattern around the dark pattern in the second plane is set to be 100. Thus, an image of the first plane (image of the pattern in the reticle plane) can be more precisely formed in the second plane (wafer plane, or image plane of the projection optical system).

Moreover, in the projection optical system of the first aspect of the present invention, when a projection pattern which has a dark pattern and a bright pattern around the dark pattern and is placed in the first plane is projected onto the second plane, the average illuminance in the area where a projected image of the dark pattern is formed in the second plane is more preferably 3 or less, where the illuminance of an image of the bright pattern around the dark pattern in the second plane is set to be 100. Thus, an image of the first plane (image of the pattern in the reticle plane) can be further more precisely formed in the second plane (wafer plane, or image plane of the projection optical system).

According to the projection optical systems of first and second aspects of the present invention, the influence of flare in the second plane can be significantly reduced. Therefore, an image of the first plane (image of the pattern in the reticle plane) can be very favorably and precisely formed in the second plane (wafer plane, or image plane of the projection optical system) using exposure light in a wavelength region of shorter than 200 nm.

Further, the projection optical system of a third aspect of the present invention has a feature in that, when a pattern having a predetermined line width is formed on a substrate placed in the second plane, the change amount in line width of a second pattern relative to the line width of a first pattern is 15% or less, where the first pattern means the pattern which is formed when the surrounding portion of the pattern is a dark portion, and the second pattern means the pattern which is formed when the surrounding portion of the pattern is a bright portion.

According to the projection optical system of the third aspect of the present invention, the change amount in line width between the first pattern which is formed when the surrounding portion of the pattern is a dark portion and the second pattern which is formed when the surrounding portion of the pattern is a bright portion is limited to 15% or less. Therefore, in this projection optical system, the integral of the light intensity of flare light in the dark pattern, the maximum value of the light intensity of the flare light, and the range of a point in the second plane where the flare light at the intensity peak reaches are limited within predetermined ranges. Accordingly, when an image of the first plane is formed in the second plane using exposure light in a wavelength region of shorter than 200 nm, the image of the first plane can be precisely formed in the second plane.

The projection optical system of a fourth aspect of the present invention is a projection optical system for forming an image of a pattern in a first plane onto a second plane using exposure light in a wavelength region of shorter than 200 nm. This projection optical system has a feature in that, when one bright point is located in the first plane, the total energy amount within an annular area in a range apart from the gravity center position of an image of the bright point in the second plane by 1 µm to 4 µm is 1.5 or less, where the total energy amount in the bright point image in the second plane is set to be 100. Thus, an image of the first plane (image of the pattern in the reticle plane) can be more precisely formed in the second plane (wafer plane, or image plane of the projection optical system).

Moreover, in the projection optical system of the fourth aspect of the present invention, which is a projection optical system for forming an image of a pattern in a first plane onto a second plane using exposure light in a wavelength region of shorter than 200 nm, when one bright point is located in the first plane, the total energy amount within an annular area in a range apart from the gravity center position of an image of the bright point in the second plane by 1 $\mu$m to 4 $\mu$m is preferably 0.8 or less, where the total energy amount in the bright point image in the second plane is set to be 100. According to this projection optical system, an image of the first plane (image of the pattern in the reticle plane) can be further more precisely formed in the second plane (wafer plane, or image plane of the projection optical system).

Further, the projection optical system of a fifth aspect of the present invention has a feature in that, when a pattern having a predetermined line width is formed on a substrate placed in the second plane, the change amount inline width of a second pattern relative to the line width of a first pattern is 15% or less, where the first pattern means the pattern which is formed when the surrounding portion of the pattern is a dark portion, and the second pattern means the pattern which is formed when the surrounding portion of the pattern is a bright portion.

According to this projection optical system of the fifth aspect of the present invention, the change amount in line width between the first pattern which is formed when the surrounding portion of the pattern is a dark portion and the second pattern which is formed when the surrounding portion of the pattern is a bright portion is limited to 15% or less. Therefore, the average illuminance in the area of an image of the dark pattern formed in the second plane and the total energy amount in a predetermined annular area of an image of the bright point formed in the second plane are limited within preferable ranges. Accordingly, when an image of the first plane is formed in the second plane using exposure light in a wavelength region of shorter than 200 nm, the image of the first plane can be precisely formed in the second plane.

Moreover, the projection optical system of a sixth aspect of the present invention is a projection optical system for forming an image of a first plane onto a second plane using exposure light in a wavelength region of shorter than 200 nm. This projection optical system has a feature in that, when a pattern having a predetermined line width is formed on a substrate placed in the second plane, the change amount in line width of a second pattern relative to the line width of a first pattern is 15% or less, where the first pattern means the pattern which is formed when the surrounding portion of the pattern is a dark portion, and the second pattern means the pattern which is formed when the surrounding portion of the pattern is a bright portion.

Here, in the projection optical system of the sixth aspect of the present invention, when a pattern having a predetermined line width is formed on a substrate placed in the second plane, the change amount in line width of a second pattern relative to the line width of a first pattern is preferably 12% or less, where the first pattern means the pattern which is formed when the surrounding portion of the pattern is a dark portion, and the second pattern means the pattern which is formed when the surrounding portion of the pattern is a bright portion. Furthermore, in the projection optical system of the sixth aspect of the present invention, when a pattern having a predetermined line width is formed on a substrate placed in the second plane, the change amount in line width of a second pattern relative to the line width of a first pattern is more preferably 8% or less, where the first pattern means the pattern which is formed when the surrounding portion of the pattern is a dark portion, and the second pattern means the pattern which is formed when the surrounding portion of the pattern is a bright portion.

According to the projection optical system of the sixth aspect of the present invention, the change amount in line width between the first pattern which is formed when the surrounding portion of the pattern is a dark portion and the second pattern which is formed when the surrounding portion of the pattern is a bright portion is limited to 15% or less. Therefore, in this projection optical system, the average illuminance in the area of an image of a dark pattern formed in the second plane and the total energy amount in a predetermined annular area of an image of a bright point formed in the second plane are limited within predetermined ranges. Accordingly, when an image of the first plane is formed in the second plane using exposure light in a wavelength region of shorter than 200 nm, the image of the first plane can be precisely formed in the second plane.

Moreover, if the change amount in line width between the first pattern which is formed when the surrounding portion of the pattern is a dark portion and the second pattern which is formed when the surrounding portion of the pattern is a bright portion is limited to 12% or less, the average illuminance in the area of an image of a dark pattern formed in the second plane and the total energy amount in a predetermined annular area of an image of a bright point formed in the second plane are limited within narrower ranges compared to the case where the change amount in line width is 15%. Accordingly, when an image of the first plane is formed in the second plane using exposure light in a wavelength region of shorter than 200 nm, the image of the first plane can be more precisely formed in the second plane.

Furthermore, if the change amount in line width between the first pattern which is formed when the surrounding portion of the pattern is a dark portion and the second pattern which is formed when the surrounding portion of the pattern is a bright portion is limited to 8% or less, the average illuminance in the area of an image of a dark pattern formed in the second plane and the total energy amount in a predetermined annular area of an image of a bright point formed in the second plane are limited within further narrower ranges than those in the case where the change amount in line width is 12%. Accordingly, when an image of the first plane is formed in the second plane using exposure light in a wavelength region of shorter than 200 nm, the image of the first plane can be more precisely formed in the second plane.

Moreover, the exposure apparatus of a seventh aspect of the present invention has a feature of including an illumination optical system for illuminating a reticle placed in the first plane using exposure light in a wavelength region of shorter than 200 nm, and the projection optical system of anyone of the first to sixth aspects of the present invention for projecting an image of a pattern of the reticle onto a substrate placed in the second plane.

According to this exposure apparatus of the seventh aspect of the present invention, the integral of the light intensity of flare light in a dark pattern, the maximum value of the light intensity of the flare light, and the range of a point in the second plane where the flare light at the intensity peak reaches are limited within predetermined ranges. Therefore, when an image of a reticle is formed on a wafer using exposure light in a wavelength region of shorter than 200 nm, the image of the reticle can be precisely formed on the wafer.

Further, the exposure method of a eighth aspect of the present invention has a feature of including an illumination process for illuminating a reticle placed in the first plane using exposure light in a wavelength region of shorter than 200 nm, and a projection process for projecting an image of a pattern of the reticle onto a substrate placed in the second plane using the projection optical system of any one of the first to sixth aspects of the present invention.

According to this exposure method of the eighth aspect of the present invention, the average illuminance in the area of an image of the dark pattern formed in the second plane and the total energy amount in a predetermined annular area of an image of the bright point formed in the second plane are limited within preferable ranges. Therefore, an image of a reticle can be precisely formed on a wafer using exposure light in a wavelength region of shorter than 200 nm.

DESCRIPTION OF THE PREFERRED EMBODIMENT

Figure 1:
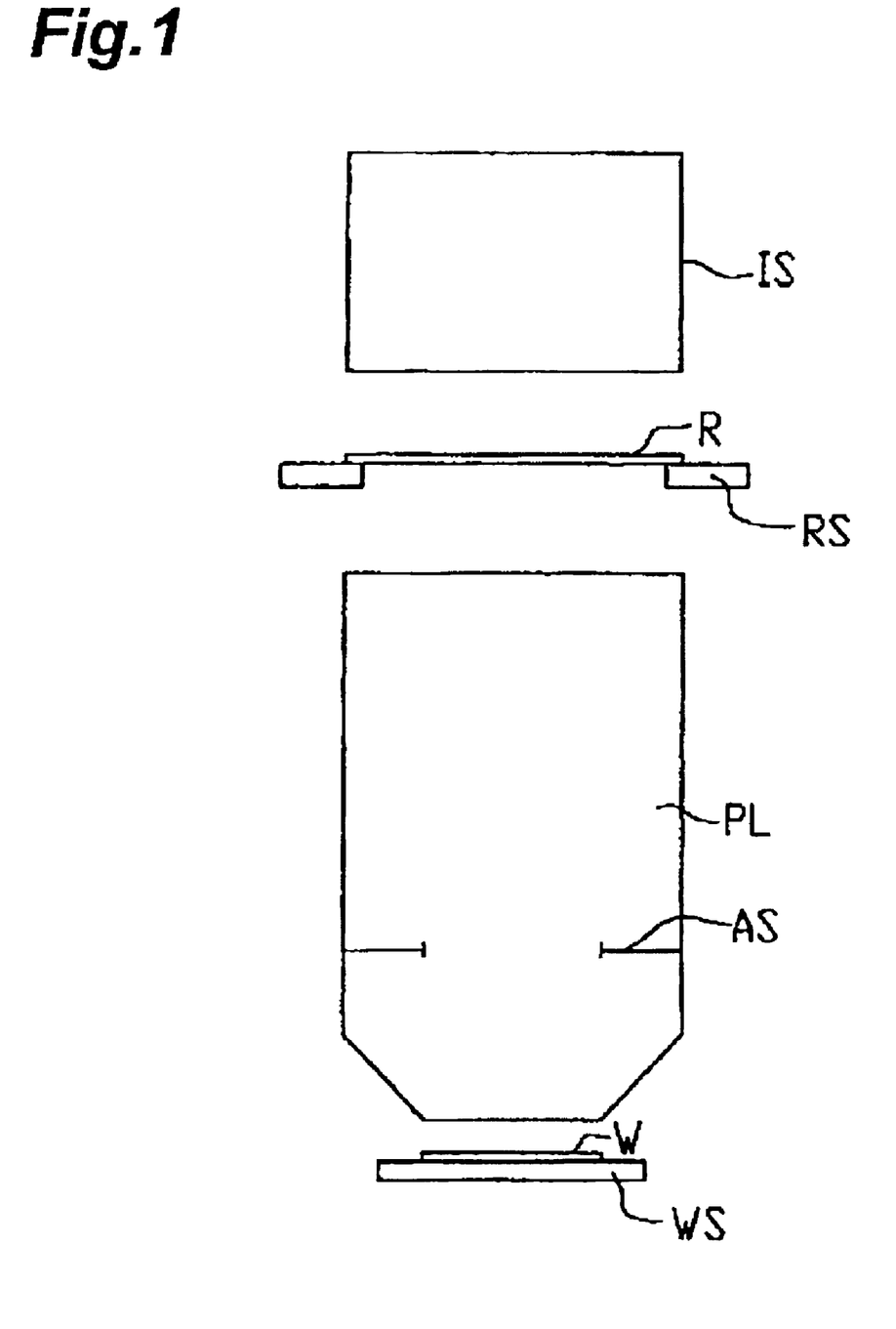
FIG. 1 is a view showing the entire schematic configuration of an exposure apparatus according to an embodiment of the present invention.

Hereinafter, referring to the drawings, an embodiment of the present invention will be described. FIG. 1 is a view showing the configuration of a projection exposure apparatus including a projection optical system.

As shown in FIG. 1, a reticle R as a projection master having a predetermined circuit pattern formed thereon is placed in the object plane (first plane) of the projection optical system PL, and a wafer W as a substrate having photoresist applied thereto is placed in the image plane (second plane) of the projection optical system PL. The reticle R is held on a reticle stage RS, and the wafer W is held on a wafer stage WS. Above the reticle R, an illumination optical system IS for evenly illuminating the reticle R is placed.

The projection optical system PL has a variable aperture stop AS in the vicinity of the pupil position, and is practically telecentric on both reticle R and wafer W sides. Further, the numerical aperture (N.A.) of the projection optical system PL in not less than 0.78. The illumination optical system IS comprises an ArF excimer laser light source, a fly's eye lens (an optical integrator) for equalizing the illumination distribution of the exposure light from the ArF excimer laser light source, an aperture stop for the illumination system, a variable field stop (reticle blind), a condenser lens system, and the like. The optical integrator may be a glass rod, microlens array or a diffractive optical element and the like. Further, the illumination system may include a zoom system for changing a value. Further, the illumination system may include an adjustable axicon system having at least two axicons (at least one of two axicons is movable) or a changeable diffractive optical system having at least two diffractive optical elements so as to perform annular illumination or multipole illumination. The exposure light supplied from the illumination optical system IS illuminates the reticle R, and an image of the light source in the illumination optical system IS is formed at the pupil position of the projection optical system PL, thus performing so-called Koehler illumination. An image of the pattern on the reticle R illuminated by Koehler illumination is demagnified at a projection magnification through the projection optical system PL and exposed (transferred) on the wafer W.

Here, a combination of a plurality of lenses (optical elements) constitutes the projection optical system PL. As material for the lenses constituting the projection optical system PL, quartz, fluorite, and the like are used. Incidentally, as a result of assiduous research by the inventors of the present application, it has been proved that local flare is caused by high frequency components of the heterogeneity inside fluorite, which is used as material for optical elements constituting the projection optical system, and/or high frequency components of the roughness of the surface shape of the fluorite. In the projection optical system PL according to the present embodiment, flare due to fluorite is decreased by reducing the number of lenses using fluorite as material thereof to a predetermined number (for example, the predetermined number is six, preferably four.) or less.

Figure 10:
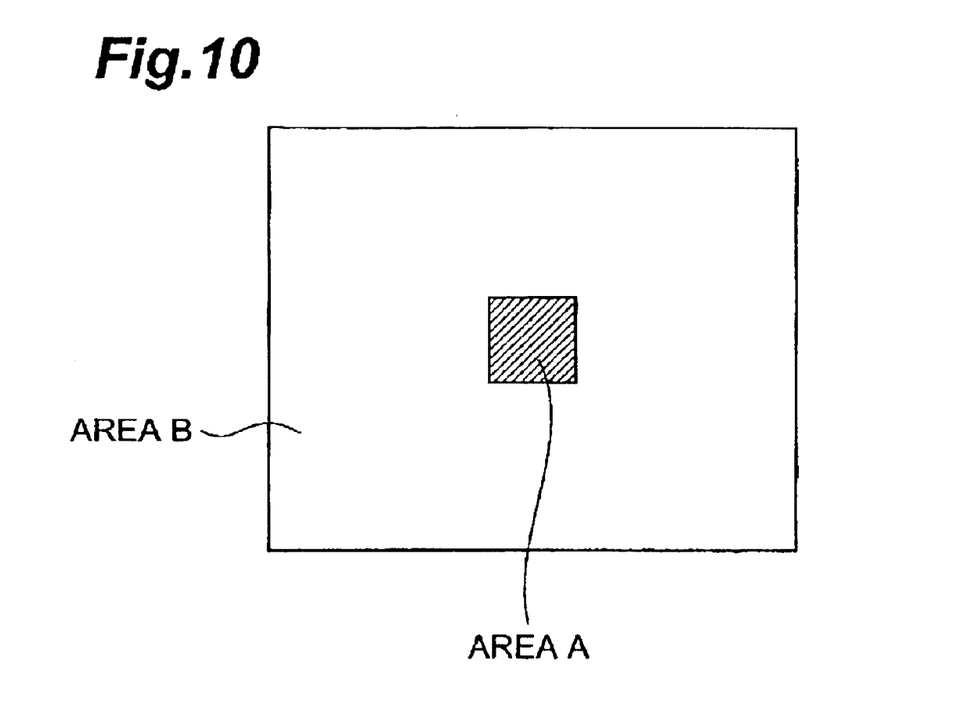
FIG. 10 is a view showing an example of a projection pattern (isolated dark pattern) of a reticle for performing flare measurement according to the embodiment of the present invention.
Figure 11:
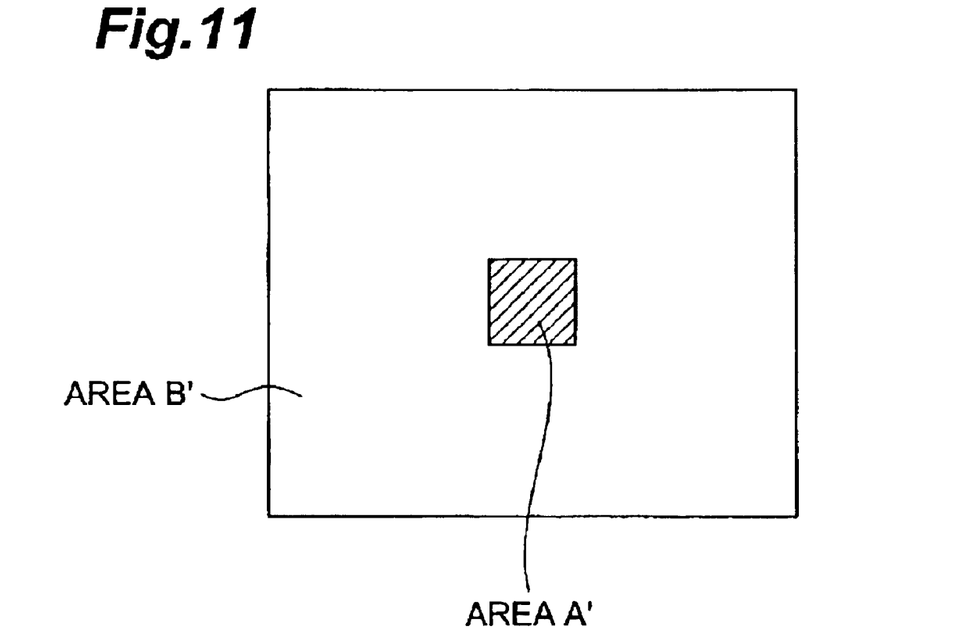
FIG. 11 is a view showing a state of an image of the projection pattern of the reticle shown in FIG. 10 when it is projected onto the wafer plane.
Figure 12:
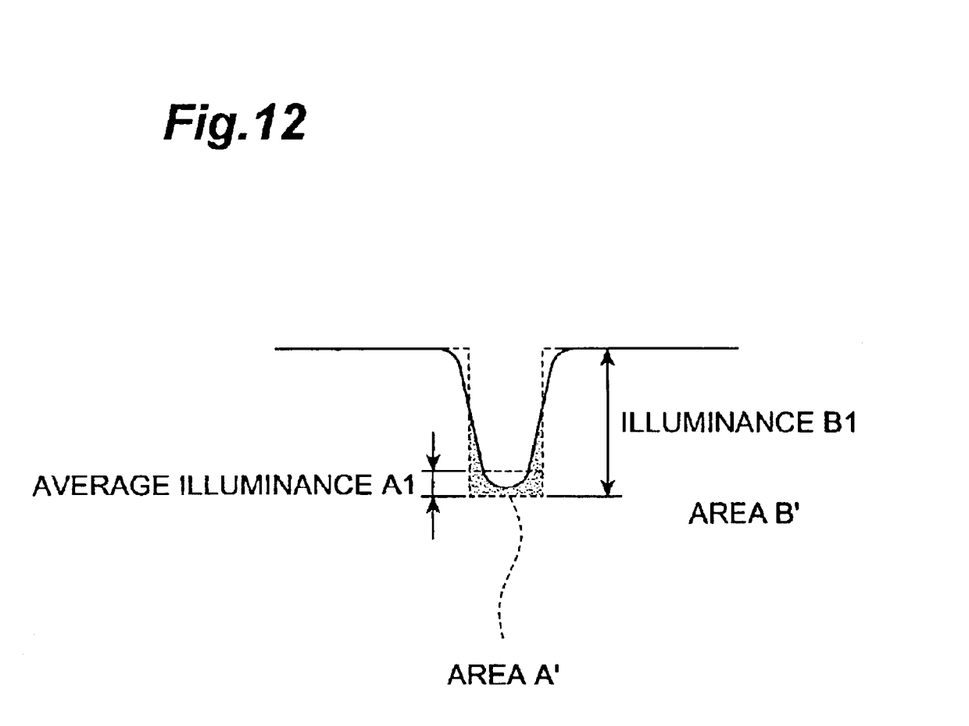
FIG. 12 is a view showing a state of the illuminance in an image of the projection pattern of the reticle (isolated dark pattern image area and bright pattern image area) shown in FIG. 11.

In this projection optical system PL, since the number of lenses using fluorite as material thereof is reduced to a predetermined number or less, the amount of local flare light on the wafer W, the maximum value of the light intensity of flare light, and the range on the wafer W where flare light reaches are limited within allowable ranges. FIG. 11 shows an image projected onto the second plane (wafer plane)

when a reticle R (mask), which as shown in FIG. 10, for example, has a dark pattern (area A in the drawing) surrounded by a bright pattern (area B in the drawing) thereon, is set at the position of the first plane (wafer plane). In this case, when light (light in a wavelength region of shorter than 200 nm) from the surrounding bright pattern B in the first plane passes through the projection optical system, light diffracted by the aperture stop in the projection optical system, and flare light generated in optical members such as lenses constituting the projection optical system reach the area A' (area of an image of the dark pattern) where the dark pattern must be projected, and the illuminance therein does not become zero. FIG. 12 is a view showing the illumination distribution in the vicinity of this area A'. As shown in the drawing, a mask having any pattern configuration can be projected and exposed with high precision by setting the average illuminance A1 lower than 8, where the illuminance in the area B1 sufficiently apart from the area A' is referred to as the illuminance B1, the average illuminance in the area A' is referred to as the illuminance A1, and the illuminance B1 is normalized as 100. Considering the trend toward fine patterns, it is more preferable that the illuminance A1 is 5 or less. Incidentally, a dark pattern in the present invention means a small dark portion (light shield portion) which is formed in a relatively large bright portion (light transmission portion). In addition, a bright point in the present invention means a small bright portion (light transmission portion) which is formed in a relatively large dark portion (light shield portion).

Therefore, in this projection optical system PL, when an image of the reticle R placed in the object plane (first plane) is formed on the wafer W placed in the image plane (second plane) using exposure light in a wavelength region of shorter than 200 nm, the image of the reticle R can be precisely formed on the wafer W.

In the present embodiment using light in a wavelength region of shorter than 200 nm, as described above, when a projection pattern which has a dark pattern and a bright pattern around the dark pattern and which is located in the reticle R plane (first plane) is projected onto the wafer plane (second plane) as image plane, the average illuminance in the area where a projected image of the dark pattern is formed in the wafer plane (second plane) is preferably 5 or less, where the illuminance of an image of the bright pattern around the dark pattern in the wafer plane (second plane) is set to be 100. In this case, an image of the reticle can be more precisely formed on the wafer.

Moreover, when a projection pattern which has a dark pattern and a bright pattern around the dark pattern and which is located in the reticle R plane (first plane) is projected onto the wafer plane (second plane), the average illuminance in the area where a projected image of the dark pattern is formed in the wafer plane (second plane) is more preferably 3 or less, where the illuminance of an image of the bright pattern around the dark pattern in the wafer plane (second plane) is set to be 100. In this case, adverse influences of flare and the like are further reduced, whereby an image of the reticle can be further more precisely formed on the wafer.

Figure 13:
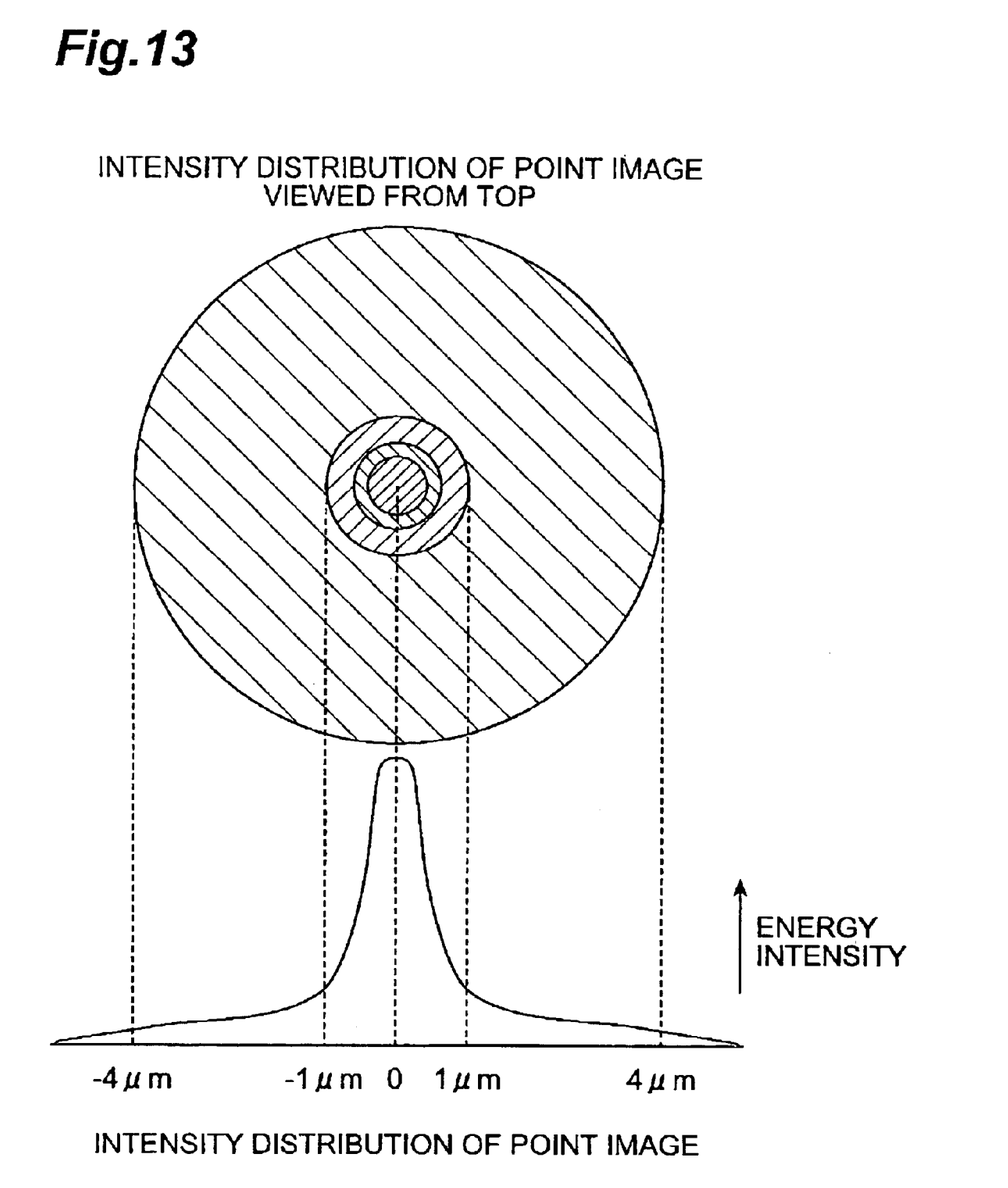
FIG. 13 is a view showing the intensity distribution of an image of a bright point formed in the wafer plane.

Moreover, in the present embodiment using light in a wavelength region of shorter than 200 nm, when a pattern regarded as one point, such as a contact hole, exists in the reticle R plane (first plane) and an image thereof is projected onto the wafer plane (second plane, or image plane), the intensity of the point image has the distribution shown in FIG. 13. When the center (gravity center) of the point image is set to be the origin, the total energy amount in the annular area having an inner radius of 1 $\mu$m and an outer radius of 4 $\mu$m is 1.5 or less, where the total energy amount in the whole point image in the wafer plane (second plane, or image plane) is set to be 100. Thus, a mask having any pattern configuration can be projected and exposed with high precision. Considering the trend toward fine patterns, it is preferable that the total energy amount in the annular area having an inner radius of 1 $\mu$m and an outer radius of 4 $\mu$m is 0.8 or less.

Thus, an image of a reticle can be further more precisely formed on a wafer by setting the total energy amount in the annular area having an inner radius of 1 $\mu$m and an outer radius of 4 $\mu$m to be 0.8 or less.

Figure 2:
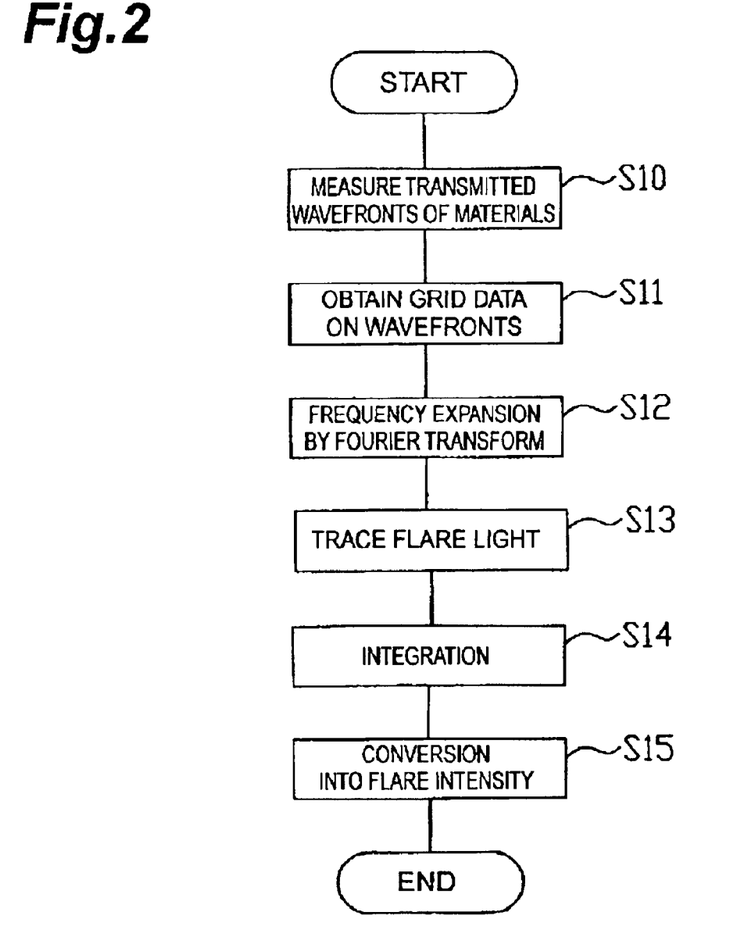
FIG. 2 is a flowchart for explaining the measurement of local flare light existing in a projection optical system of the exposure apparatus according to the embodiment of the present invention.

Next, referring to the flowchart of FIG. 2, the measurement of the light intensity of local flare light caused in the above-described projection optical system PL will be described. Note that the projection optical system, the light intensity of local flare light caused in which is measured, is one using an ArF excimer laser light as exposure light, where the numerical aperture (N.A.) is 0.78 and the magnification is 0.25.

Figure 3:
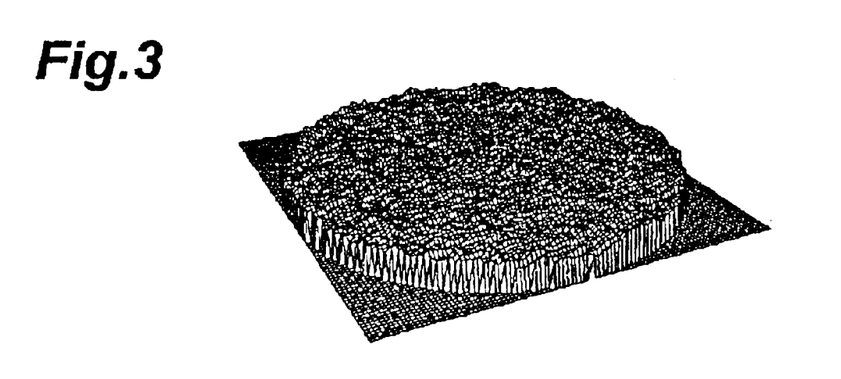
FIG. 3 is a view showing the wavefront of exposure light which has been transmitted through the projection optical system of the exposure apparatus, according to the embodiment of the present invention.

First, transmitted wavefronts of each lens material constituting the projection optical system PL are measured (Step S10). In measuring these transmitted wavefronts, the same wavelength as that of exposure light (ArF excimer laser in the present embodiment) is preferably applied. Then, the measurement results of transmitted wavefronts of each lens material are obtained as grid data on wavefronts (Step S11). Here, FIG. 3 shows the grid data on a transmitted wavefront of one lens material of the plurality of lens elements constituting the projection optical system PL, which is measured using measurement light having the same wavelength as the exposure light.

Figure 4:
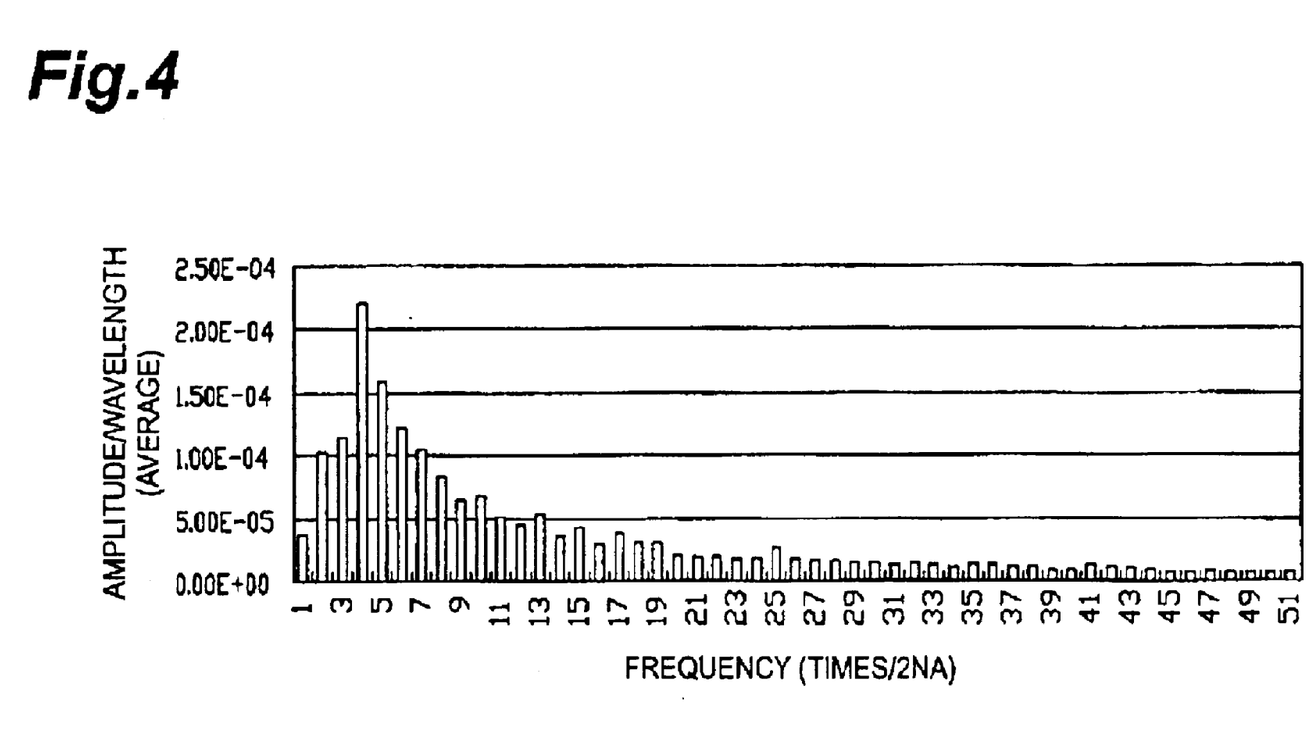
FIG. 4 is a graph showing the relationship between the frequency and the amplitude which are obtained by expanding the transmitted wavefront of exposure light in terms of frequency, according to the embodiment of the present invention.

Next, Fourier transform is performed on the measured data on the transmitted wavefronts, thereby expanding the data in terms of frequency (Step S12). FIG. 4 is a graph showing the relationship between the spatial frequency and the amplitude. Note that, in FIG. 4, light having an amplitude larger than $2 \times 10^{-5}$ is referred to as local flare light.

Next, using information (radius of curvature, surface separation, refractive index, and the like) regarding each lens element constituting the projection optical system PL, rays of the above-described local flare light are traced to determine the distribution of flare light on the wafer W (Step S13).

Figure 5:
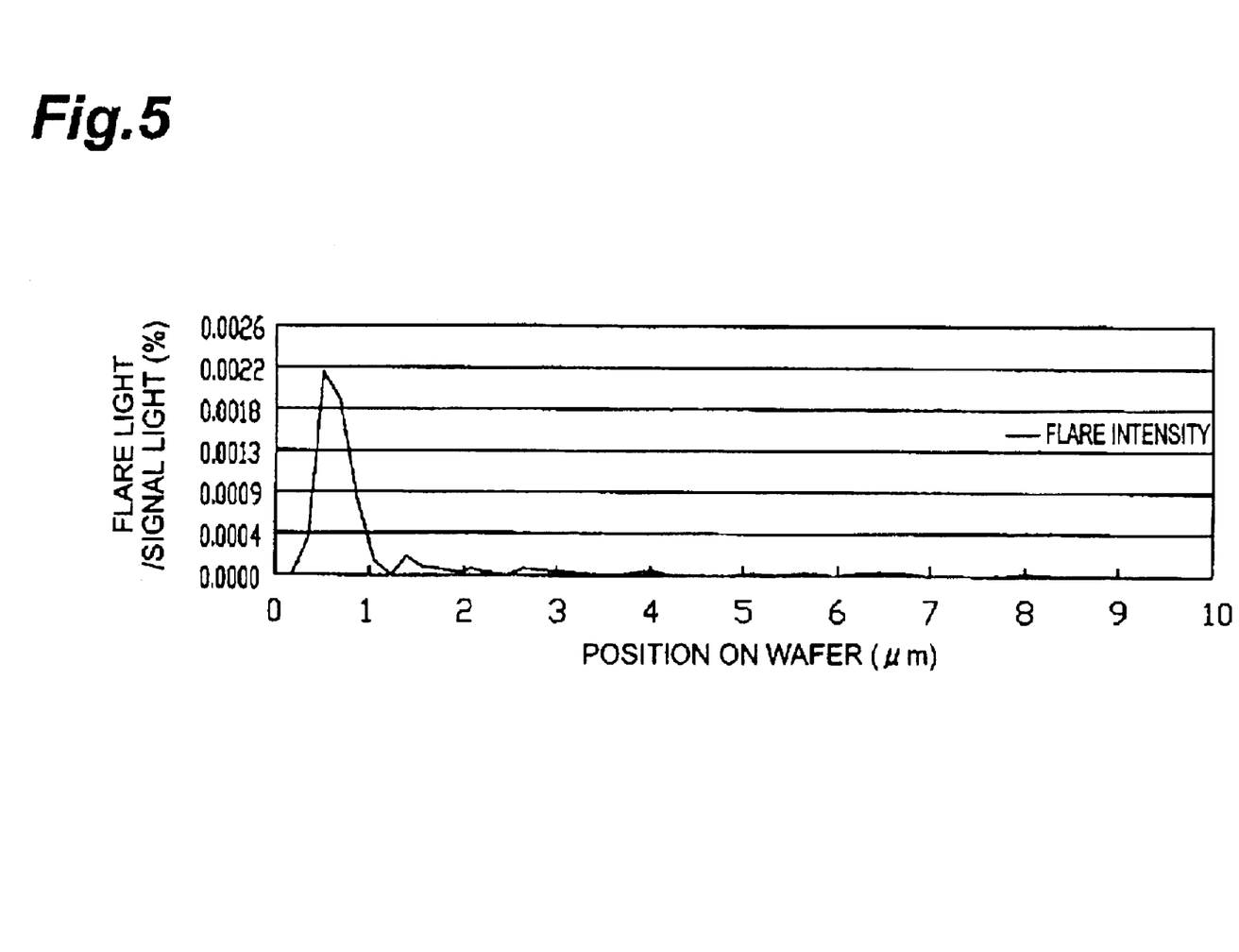
FIG. 5 is a graph showing the relationship between the intensity of flare light and the position on a wafer, according to the embodiment of the present invention.

Incidentally, the result shown in FIG. 4 is data on one image point on the wafer W (distribution of flare about one image point). Accordingly, the data is integrated (Step S14) and converted into the light intensity of flare light (Step S15). Here, FIG. 5 is a graph showing the distribution of the flare light on the wafer W when the lens material having the characteristics shown in FIG. 4 is located at the pupil position of the projection optical system PL.

According to the simulation result obtained by the above-described steps, in the projection optical system PL according to the present embodiment, when a projection pattern which has a dark pattern and a bright pattern around the dark pattern and is located in the reticle R plane is projected onto the wafer plane as image plane, the average illuminance in the area where a projected image of the dark pattern is formed in the wafer plane is 1.5, where the illuminance of an image of the bright pattern around the dark pattern in the wafer plane is set to be 100.

Moreover, according to the above-described simulation result, in the projection optical system PL according to the present embodiment, when one bright point is located in the reticle R plane, the total energy amount within the annular area in the range apart from the gravity center position of an image of the bright point by 1 µm to 4 µm is 0.2, where the total energy amount in the bright point image in the wafer plane (image plane) is set to be 100.

Thus, when a pattern image of the reticle R is formed on the wafer W using light in a wavelength region of shorter than 200 nm as exposure light, the pattern image of the reticle R can be precisely formed on the wafer W.

Here, for measuring transmitted wavefronts of lens materials constituting the projection optical system PL, the oil-on plate method can be adopted, for example. This is the measurement of a transmitted wavefront aberration using as a sample an optical member which is machined, for example, in the shape of a circular cylinder or a rod, in an optical system of a laser interferometer. Note that the refractive index distribution of the optical member can be determined by dividing the transmitted wavefront aberration obtained using the interferometer by the thickness of the optical member.

Figure 6:
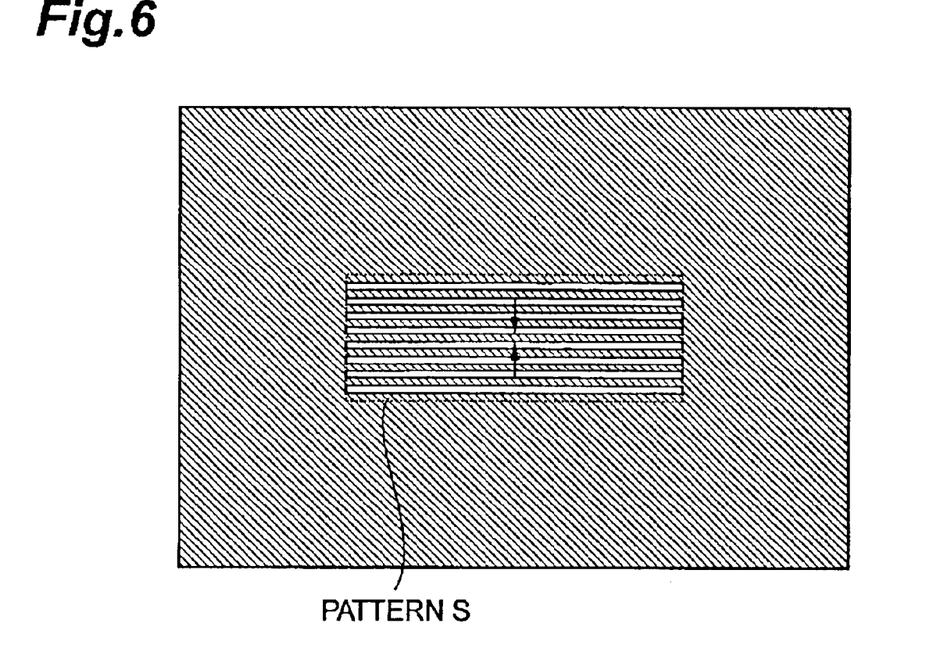
FIG. 6 is a view showing a shape of a pattern to be formed on a wafer using the exposure apparatus according to the embodiment of the present invention.
Figure 7:
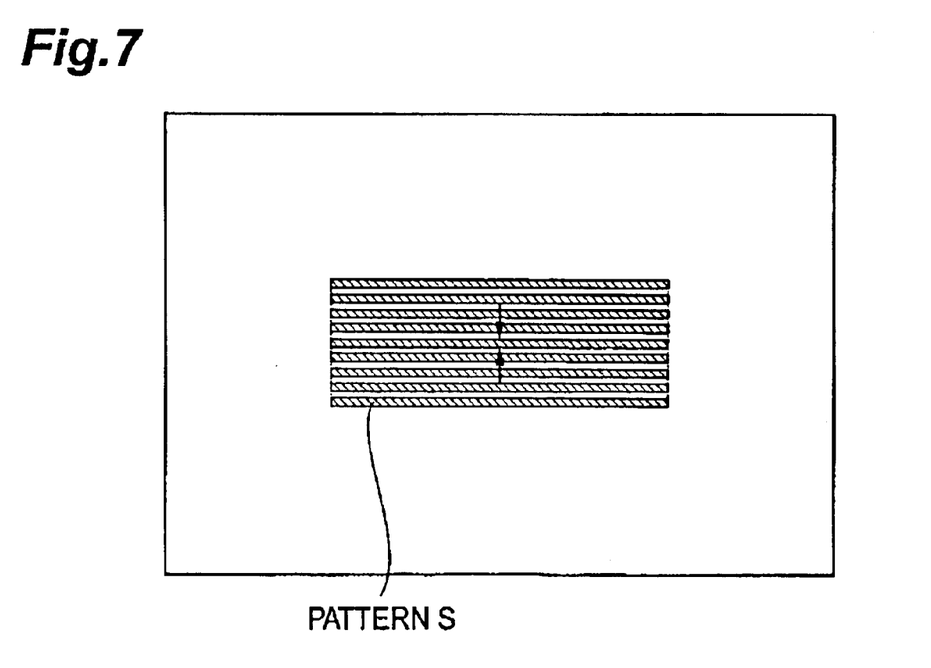
FIG. 7 is a view showing a shape of a pattern to be formed on a wafer using the exposure apparatus according to the embodiment of the present invention.

Next, it will be described that a pattern having a predetermined line width is formed on the wafer W using the exposure apparatus shown in FIG. 1 in order to estimate the amount, the maximum value, and the like of the local flare light caused in the projection optical system PL. Here, FIG. 6 shows a pattern shape when the surrounding portion of the pattern having a predetermined line width is a dark portion, and FIG. 7 shows a pattern shape when the surrounding portion of the pattern having a predetermined line width is a bright portion. Note that the line width of the pattern S shown in FIG. 6 and the line width of the pattern S shown in FIG. 7 are identical.

Using the exposure apparatus shown in FIG. 1, the shape of the pattern S shown in FIG. 6, whose surrounding portion is a dark portion, is formed as a first pattern on the wafer W. And, using the exposure apparatus shown in FIG. 1, the shape of the pattern S shown in FIG. 7, whose surrounding portion is a bright portion, is formed as a second pattern on the wafer W.

Then, the line widths of the formed first and second patterns were measured for critical dimension (CD). That is, CD measurement was performed on the line widths of the patterns which are sandwiched by arrows in FIGS. 6 and 7. As a result, the change amount, that is, the decreased amount in line width of the second pattern relative to the line width of the first pattern was 15% or less. Therefore, in this projection optical system, it is deduced that the average illuminance in the area of an image of a dark pattern formed in the second plane and the total energy amount in a predetermined annular area of an image of a bright point formed in the second plane are limited within predetermined ranges.

Accordingly, for example, if a pattern having a line width of 150 nm is formed on the wafer W to manufacture a semiconductor device or the like, a probability of defective products can be limited to a very low level, thus manufacturing a precision semiconductor device or the like.

Incidentally, in the present embodiment, if the change amount, that is, the decreased amount in line width of the second pattern relative to the line width of the first pattern is 12% or less, a probability of defective products can be limited to a very low level, thus manufacturing a precision semiconductor device or the like, even when a pattern having, for example, a line width of 120 nm is formed on the wafer W to manufacture a semiconductor device or the like. Furthermore, if the change amount, that is, the decreased amount in line width of the second pattern relative to the line width of the first pattern is 8% or less, a probability of defective products can be limited to a very low level, thus manufacturing a precision semiconductor device or the like, even when a pattern having, for example, a line width of 100 nm is formed on the wafer W to manufacture a semiconductor device or the like.

Incidentally, in the above-described embodiment, the ArF excimer laser light source is used as a light source of the illumination optical system IS. However, another light source which emits light having a wavelength of 200 nm or less, such as a $F_2$ laser light source, can be used.

Figure 8:
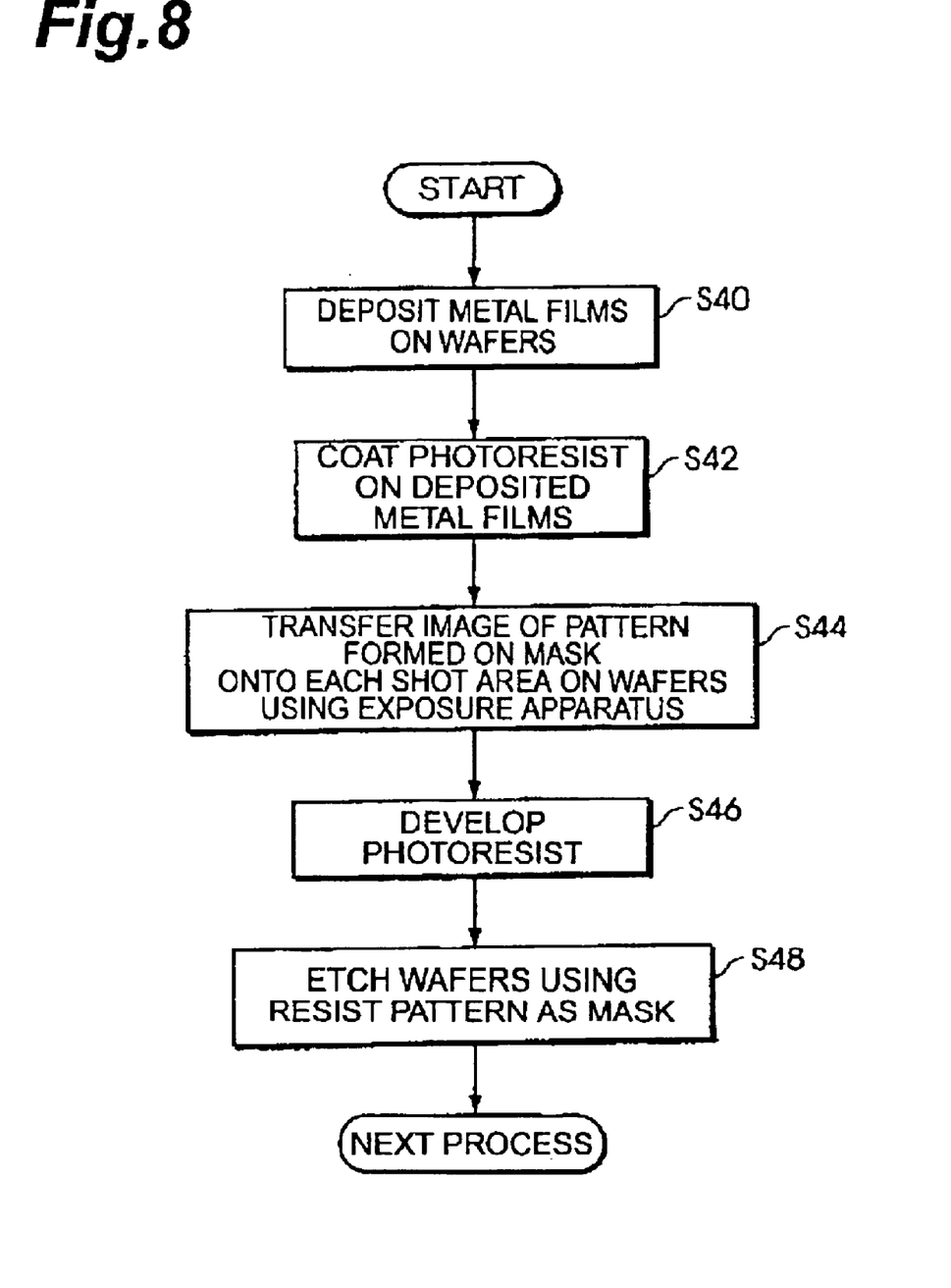
FIG. 8 is a flowchart for a method of manufacturing a semiconductor device as a micro device according to the embodiment of the present invention.

Next, a micro device manufacturing method using the exposure apparatus according to the embodiment of the present invention in lithography processes will be described. FIG. 8 is a flowchart for explaining a manufacturing method of a semiconductor device as a micro device. First, at Step S40 in FIG. 8, metal films are deposited on wafers in one lot. At the next Step S42, photoresist is coated on the metal films on the wafers in one lot. Thereafter, at Step S44, using the exposure apparatus according to the embodiment of the present invention, an image of a pattern on a mask (reticle) M is sequentially exposed and transferred in each shot area on the wafers W in one lot through the projection optical system PL. Specifically, the mask M is illuminated using the illumination optical system IS, and an image of the pattern on the mask M is projected, exposed, and transferred on the wafers W using the projection optical system PL. Therefore, when an image of the reticle R is formed on the wafers using exposure light from the ArF excimer laser light source, the image of the reticle R can be precisely formed on the wafers W.

Thereafter, the photoresist on the wafers W in one lot is developed at Step S46, and then etching is performed on the wafers W in one lot using the resist pattern as a mask at Step S48, whereby a circuit pattern corresponding to the pattern on the mask is formed in each shot area on each wafer W. Then, the formation and the like of a circuit pattern in upper layers are performed, thereby manufacturing devices such as semiconductor devices. According to the above-described semiconductor device manufacturing method, a semiconductor device having a very fine circuit pattern can be obtained with high throughput.

Figure 9:
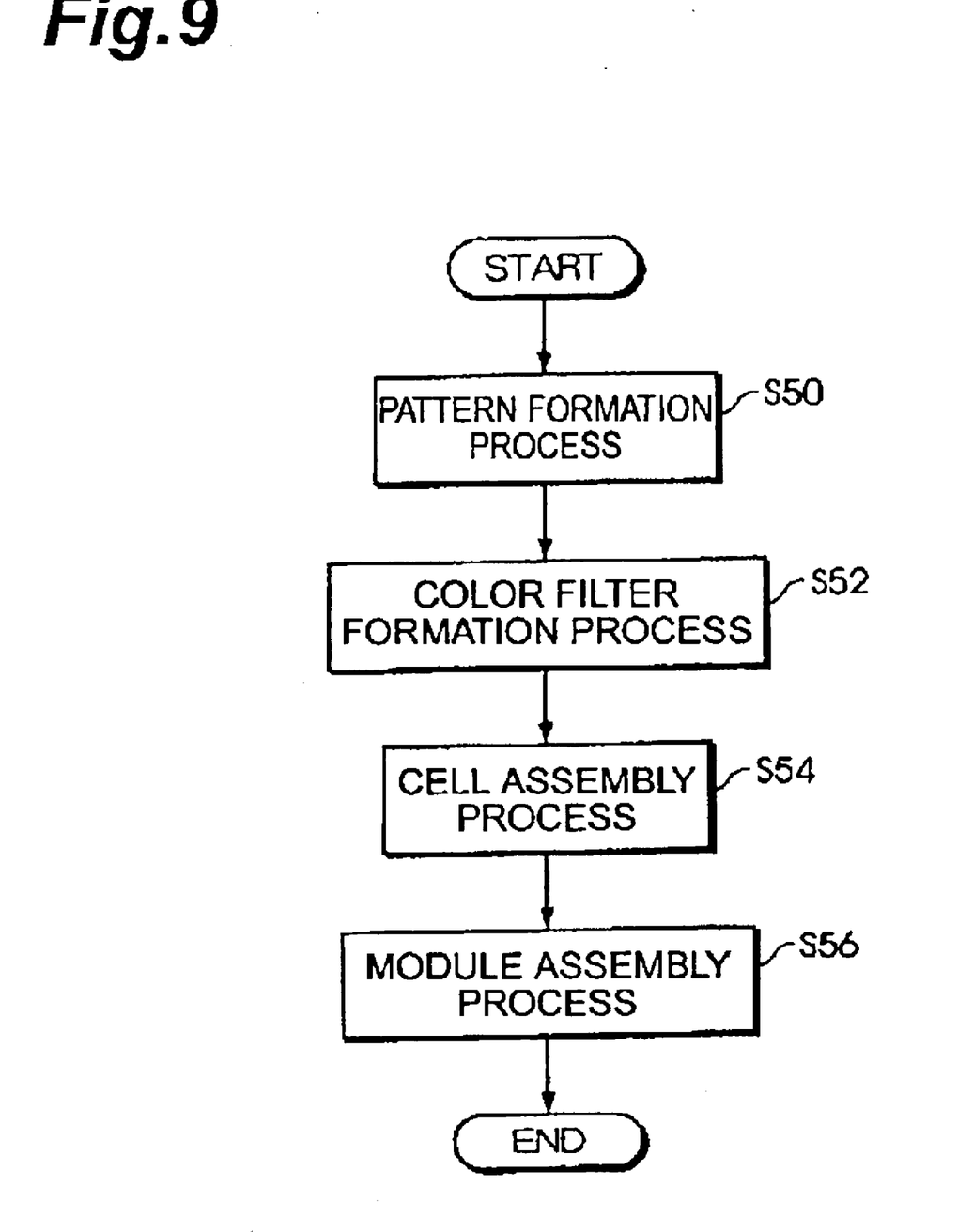
FIG. 9 is a flowchart for a method of manufacturing a liquid crystal display device as a micro device according to the embodiment of the present invention.

Moreover, in the exposure apparatus according to the embodiment of the present invention, by forming a predetermined pattern (circuit pattern, electrode pattern, or the like) on a plate (glass substrate), a liquid crystal display device as a micro device can also be obtained. Hereinafter, referring to the flowchart of FIG. 9, an example of the methods in this case will be described. FIG. 9 is a flowchart for explaining a method of manufacturing a liquid crystal display device as a micro device by forming a predetermined pattern on a plate using the exposure apparatus of the present embodiment.

At the pattern formation process S50 of FIG. 9, a photolithography process, in which a pattern of a mask is transferred and exposed on a photosensitive substrate (glass substrate or the like having resist coated thereon), is performed using the exposure apparatus of the present embodiment. Specifically, a mask M is illuminated using the illumination optical system IS, and an image of a pattern on the mask M is projected, exposed, and transferred on a photosensitive substrate using the projection optical system PL. Therefore, when an image of the mask M is formed on the photosensitive substrate using exposure light from the ArF excimer laser light source, the image of the mask M can be precisely formed on the photosensitive substrate.

By this photolithography process, a predetermined pattern including many electrodes and the like is formed on the photosensitive substrate. Thereafter, the exposed substrate undergoes each process, such as a development process, an etching process, a resist removal process, and the like, whereby the predetermined pattern is formed on the substrate, and the process goes to the next color filter formation process S52.

Next, at the color filter formation process S52, a color filter in which many groups each including three dots corresponding to R (red), G (green), and b (blue) are arranged in the form of a matrix or in which a plurality of groups each including three stripe-shaped filters of R, G, and B are arranged in the direction of horizontal scanning lines, is formed. After the color filter formation process S52, a cell assembly process S54 is performed. At the cell assembly process S54, a liquid crystal panel (liquid crystal cell) is assembled using the substrate having the predetermined pattern obtained at the pattern formation process S50, the color filter obtained at the color filter formation process S52, and the like.

At the cell assembly process S54, a liquid crystal panel (liquid crystal cell) is manufactured, for example, by injecting liquid crystals between the substrate having the predetermined pattern obtained at the pattern formation process S50 and the color filter obtained at the color filter formation process S52. Thereafter, at the module assembly process S56, each part, such as an electric circuit for display operations of the assembled liquid crystal panel (liquid crystal cell) and a backlight, is attached to the liquid crystal panel, thus completing a liquid crystal display device. According to the above-described liquid crystal display device manufacturing method, a liquid crystal display device having a very fine circuit pattern can be obtained with high throughput.

According to the projection optical system of the present invention, when an image of a first plane is formed in a second plane using exposure light in a wavelength region of shorter than 200 nm, the image of the first plane can be precisely formed in the second plane, since the average illuminance in the area of an image of a dark pattern formed in the second plane and the total energy amount in a predetermined annular area of an image of a bright point formed in the second plane are limited within favorable ranges.

Moreover, according to this projection optical system, the change amount in line width between a first pattern which is formed when the surrounding portion of the pattern is a dark portion and a second pattern which is formed when the surrounding portion of the pattern is a bright portion is limited to 15% or less. Therefore, in this projection optical system, the average illuminance in the area of an image of a dark pattern formed in the second plane and the total energy amount in a predetermined annular area of an image of a bright point formed in the second plane are limited within predetermined ranges.

Furthermore, according to the exposure apparatus of the present invention, when an image of the first plane is formed in the second plane using exposure light in a wavelength region shorter than 200 nm, the image of the first plane can be precisely formed in the second plane, since the average illuminance in the area of an image of a dark pattern formed in the second plane and the total energy amount in a predetermined annular area of an image of a bright point formed in the second plane are limited within favorable ranges.

Furthermore, according to the exposure method of the present invention, when an image of the first plane is formed in the second plane using exposure light in a wavelength region shorter than 200 nm, the image of the first plane can be precisely formed in the second plane, since the average illuminance in the area of an image of a dark pattern formed in the second plane and the total energy amount in a predetermined annular area of an image of a bright point formed in the second plane are limited within favorable ranges.

What is claimed is:

1. A projection optical system for forming an image of a pattern in a first plane onto a second plane using exposure light in a wavelength region of shorter than 200 nm, wherein, when a projection pattern placed in the first plane and having a dark pattern and a light pattern around the dark pattern is projected onto the second plane, an average illuminance in a area where a projected image of the dark pattern is formed in the second plane is 8 or less, where an illuminance of an image of the light pattern around the dark pattern in the second plane is set to be 100.

2. The projection optical system according to claim 1, wherein, when one bright point is located in the first plane, a total energy amount within an annular area in a range apart from a gravity center position of an image of the bright point by 1 $\mu$m to 4 $\mu$m is 1.5 or less, where a total energy amount in the bright point image in the second plane is set to be 100.

3. The projection optical system according to claim 1, wherein, when a pattern having a predetermined line width is formed on a substrate placed in the second plane, a change amount in line width of a second pattern relative to a line width of a first pattern is 15% or less, where the first pattern means the pattern which is formed when the surrounding portion of the pattern is a dark portion, and the second pattern means the pattern which is formed when the surrounding portion of the pattern is a bright portion.

4. A projection optical system for forming an image of a pattern in a first plane onto a second plane using exposure light in a wavelength region of shorter than 200 nm, wherein, when one bright point is located in the first plane, a total energy amount in an annular area in a range apart from a gravity center position of an image of the bright point by 1 $\mu$m to 4 $\mu$m is 1.5 or less, where a total energy amount in the bright point image in the second plane is set to be 100.

5. The projection optical system according to claim 4, wherein, when a pattern having a predetermined line width is formed on a substrate placed in the second plane, a change amount in line width of a second pattern relative to a line width of a first pattern is 15% or less, where the first pattern means the pattern which is formed when a surrounding portion of the pattern is a dark portion, and the second pattern means the pattern which is formed when the surrounding portion of the pattern is a bright portion.

6. A projection optical system for forming an image of a first plane onto a second plane using exposure light in a wavelength region of shorter than 200 nm, wherein, when a pattern having a predetermined line width is formed on a substrate placed in the second plane, a change amount in line width of a second pattern relative to a line width of a first pattern is 15% or less, where the first pattern means the pattern which is formed when the surrounding portion of the pattern is a dark portion, and the second pattern means the pattern which is formed when the surrounding portion of the pattern is a bright portion.

7. An exposure apparatus, comprising:

an illumination optical system for illuminating a reticle placed in the first plane using exposure light in a wavelength region of shorter than 200 nm; and the projection optical system according to claim 1, the projection optical system being for projecting an image of a pattern of the reticle onto a substrate placed in the second plane.

8. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 1.

9. The projection optical system according to claim 2, wherein, when a pattern having a predetermined line width is formed on a substrate placed in the second plane, a change amount in line width of a second pattern relative to a line width of a first pattern is 15% or less, where the first pattern means the pattern which is formed when the surrounding portion of the pattern is a dark portion, and the second pattern means the pattern which is formed when the surrounding portion of the pattern is a bright portion.

10. An exposure apparatus, comprising:

an illumination optical system for illuminating a reticle placed in the first plane using exposure light in a wavelength region of shorter than 200 nm; and the projection optical system according to claim 2, the projection optical system being for projecting an image of a pattern of the reticle onto a substrate placed in the second plane.

11. An exposure apparatus, comprising:

an illumination optical system for illuminating a reticle placed in the first plane using exposure light in a wavelength region of shorter than 200 nm; and the projection optical system according to claim 3, the projection optical system being for projecting an image of a pattern of the reticle onto a substrate placed in the second plane.

12. An exposure apparatus, comprising:

an illumination optical system for illuminating a reticle placed in the first plane using exposure light in a wavelength region of shorter than 200 nm; and the projection optical system according to claim 9, the projection optical system being for projecting an image of a pattern of the reticle onto a substrate placed in the second plane.

13. An exposure apparatus, comprising:

an illumination optical system for illuminating a reticle placed in the first plane using exposure light in a wavelength region of shorter than 200 nm; and the projection optical system according to claim 4, the projection optical system being for projecting an image of a pattern of the reticle onto a substrate placed in the second plane.

14. An exposure apparatus, comprising:

an illumination optical system for illuminating a reticle placed in the first plane using exposure light in a wavelength region of shorter than 200 nm; and the projection optical system according to claim 5, the projection optical system being for projecting an image of a pattern of the reticle onto a substrate placed in the second plane.

15. An exposure apparatus, comprising:

an illumination optical system for illuminating a reticle placed in the first plane using exposure light in a wavelength region of shorter than 200 nm; and the projection optical system according to claim 6, the projection optical system being for projecting an image of a pattern of the reticle onto a substrate placed in the second plane.

16. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 2.

17. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 3.

18. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 9.

19. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 4.

20. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 5.

21. A method of exposure, comprising the steps of:

illuminating a reticle placed in the first plane using exposure light in a wavelength region of shorter than 200 nm; and projecting an image of a pattern of the reticle onto a substrate placed in the second plane using the projection optical system according to claim 6.

* * * * *